US007060579B2

(12) United States Patent
Chidambaram et al.

(10) Patent No.: US 7,060,579 B2
(45) Date of Patent: Jun. 13, 2006

(54) INCREASED DRIVE CURRENT BY ISOTROPIC RECESS ETCH

(75) Inventors: PR Chidambaram, Richardson, TX (US); Lindsey Hall, Plano, TX (US); Haowen Bu, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 2 days.

(21) Appl. No.: 10/902,360

(22) Filed: Jul. 29, 2004

(65) Prior Publication Data

US 2006/0024898 A1   Feb. 2, 2006

(51) Int. Cl.
*H01L 21/336* (2006.01)
*H01L 21/76* (2006.01)
*H01L 21/3205* (2006.01)
*H01L 21/4763* (2006.01)

(52) U.S. Cl. .................. 438/303; 438/297; 438/439; 438/589

(58) Field of Classification Search ............... 438/303, 438/299, 451, 589, 297, 439, 524
See application file for complete search history.

(56) References Cited

U.S. PATENT DOCUMENTS

| 6,358,806 | B1 | 3/2002 | Puchner |
| 6,368,931 | B1 | 4/2002 | Kuhn et al. |
| 6,492,216 | B1 | 12/2002 | Yeo et al. |
| 6,563,152 | B1 | 5/2003 | Roberds et al. |
| 6,583,015 | B1 | 6/2003 | Fitzgerald et al. |
| 6,621,131 | B1 | 9/2003 | Murthy et al. |
| 6,638,802 | B1 | 10/2003 | Hwang et al. |
| 6,784,076 | B1 * | 8/2004 | Gonzalez et al. ........... 438/426 |
| 2004/0007715 | A1 | 1/2004 | Webb et al. |
| 2005/0148147 | A1 * | 7/2005 | Keating et al. ............. 438/299 |

* cited by examiner

*Primary Examiner*—Chuong A. Luu
(74) *Attorney, Agent, or Firm*—Peter K. McLarty; W. James Brady, III; Frederick J. Telecky, Jr.

(57) ABSTRACT

A method (100) of forming a transistor includes forming a gate structure (108) over a semiconductor body and forming recesses (112) using an isotropic etch using the gate structure as an etch mask. The isotropic etch forms a recess in the semiconductor body that extends laterally in the semiconductor body toward a channel portion of the semiconductor body underlying the gate structure. The method further includes epitaxially growing silicon (114) comprising stress-inducing species in the recesses. The source and drain regions are then implanted (120) in the semiconductor body on opposing sides of the gate structure.

17 Claims, 8 Drawing Sheets

INCREASED DRIVE CURRENT BY ISOTROPIC RECESS ETCH

FIELD OF INVENTION

The present invention relates generally to semiconductor devices and more particularly to transistors and associated methods of manufacture having improved mobility due to channel strain.

BACKGROUND OF THE INVENTION

A conventional MOS transistor generally includes a semiconductor substrate, such as silicon, having a source, a drain, and a channel positioned between the source and drain. A gate stack composed of a conductive material (a gate conductor), an oxide layer (a gate oxide), and sidewall spacers, is typically located above the channel. The gate oxide is typically located directly above the channel, while the gate conductor, generally comprised of polycrystalline silicon (polysilicon) material, is located above the gate oxide. The sidewall spacers protect the sidewalls of the gate conductor.

Generally, for a given electric field across the channel of a MOS transistor, the amount of current that flows through the channel is directly proportional to a mobility of carriers in the channel. Thus the higher the mobility of the carriers in the channel, the more current can flow and the faster a circuit can perform when using high mobility MOS transistors. One way to increase the mobility of the carriers in the channel of an MOS transistor is to produce a mechanical stress in the channel.

A compressive strained channel has significant hole mobility enhancement over conventional devices. A tensile strained channel, such as a thin silicon channel layer grown on relaxed silicon-germanium, achieves significant electron mobility enhancement. The most common method of introducing tensile strain in a silicon channel region is to epitaxially grow the silicon channel layer on a relaxed silicon-germanium (SiGe), layer or substrate. The ability to form a relaxed SiGe layer is important in obtaining an overlying, epitaxially grown, silicon layer under biaxial tensile strain, however the attainment of the relaxed SiGe layer can be costly and difficult to achieve.

Another prior art method of obtaining a compressive strain in the channel is to epitaxially grow a SiGe layer over the entire active area. A disadvantage of this method is that germanium within the channel portion of the strain layer can migrate into the overlying gate oxide, thereby causing a relatively large interface trap density (DIT), which disadvantageously increases scattering and reduces the mobility advantages associated with the strained channel.

It would be advantageous to have a transistor device and method that effectively and reliably provides strain to the device in order to improve carrier mobility.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later.

The present invention relates to a device and method of fabrication, wherein a transistor device exhibits improved mobility due to the application of stress to the channel. The device has a stress application region formed in the semiconductor body near the channel region; consequently, less stress inducing species is needed to obtain the desired strain within the channel, thereby providing improved carrier mobility without a substantial number of threading dislocation defects.

The stress inducing regions in the semiconductor body are formed by selective epitaxial deposition of a silicon germanium material within recesses formed in the body. The recesses are formed using an isotropic etch, wherein the etched recess extends laterally toward the channel region underlying the gate. In one example, the recesses are formed in extension regions prior to the formation of source/drain sidewall spacers; in another example, the recesses are formed in the source/drain regions after the formation of the source/drain sidewall spacers. In either case, the isotropic etch employed in forming the recesses provides for the stress inducing material subsequently formed therein to reside more closely to the channel than would otherwise exist with an isotropic etch. Consequently, stress may be applied to the channel in a substantially more efficient manner.

In accordance with one aspect of the present invention, a method of forming a transistor is provided, wherein a gate structure is formed over a semiconductor body, thereby defining a channel region therebelow. Recesses are formed in the body using an isotropic etch. In one example, such recesses are formed immediately after gate patterning or after formation of offset spacers (used for extension region implants) on lateral edges of the gate. In another example, the recesses are formed after formation of the source/drain sidewall spacers, and thus reside in the source/drain regions. The recesses are then filled with a stress inducing material via a selective epitaxial deposition process. The stress inducing material has a different lattice spacing than the silicon channel, thereby imparting a compressive or tensile strain to the channel region under the gate depending upon the type of material formed in the recesses.

In one example, the semiconductor device comprises an NMOS transistor, and the stress inducing material comprises a carbon-doped silicon material. While not intending to be limited to any one theory, it is believed that the carbon-doped silicon within the recesses form an alloy that has a lattice with the same structure as the silicon body lattice, however, the carbon-doped silicon alloy has a smaller spacing. Consequently, it is believed that the carbon-doped silicon within the recesses will tend to contract, thereby creating a tensile stress within the channel of the semiconductor body underneath the gate. In another example, the semiconductor device comprises a PMOS transistor and the stress inducing material comprises a silicon germanium material. The silicon germanium material in the recesses is believed to have a larger lattice spacing, and thus upon expanding tends to create a compressive stress within the channel of the semiconductor body underneath the gate.

The following description and annexed drawings set forth in detail certain illustrative aspects and implementations of the invention. These are indicative of but a few of the various ways in which the principles of the invention may be employed.

DETAILED DESCRIPTION OF THE INVENTION

Figure 1:
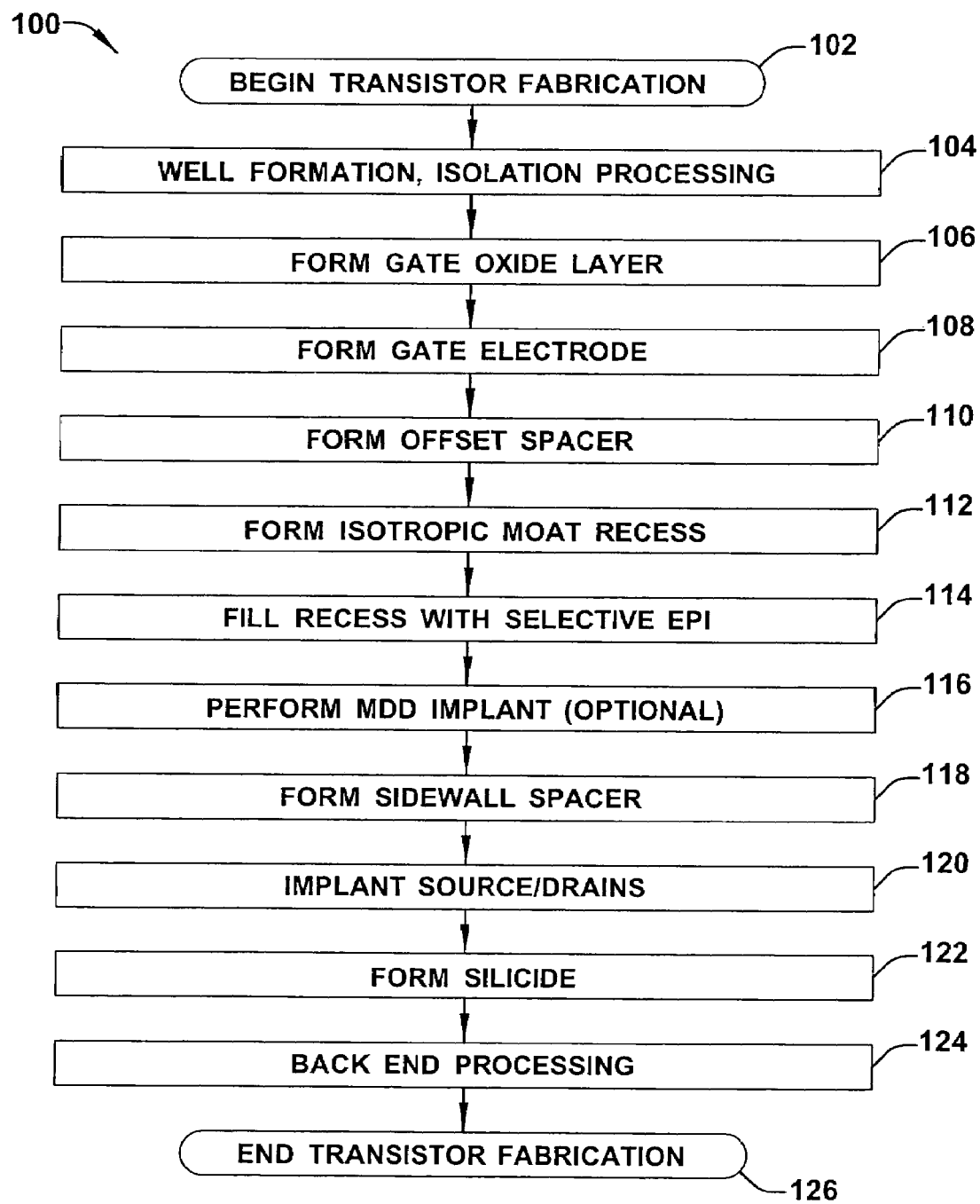
FIG. 1 is a flow chart illustrating a method of forming a transistor having improved mobility according to one aspect of the present invention.

One or more implementations of the present invention will now be described with reference to the attached drawings, wherein like reference numerals are used to refer to like elements throughout, and wherein the illustrated structures are not necessarily drawn to scale. The invention provides transistor structures and methods in which transistor mobility is improved while minimizing defects heretofore associated with conventional strained silicon device solutions.

Referring now to FIGS. 1 and 2A–2G, further aspects of the invention relate to methods of fabricating integrated circuits, wherein FIG. 1 illustrates an exemplary method 100 in accordance with the invention, and FIGS. 2A–2G illustrate the exemplary transistor device at various stages of fabrication in accordance with the invention. While the exemplary method 100 is illustrated and described below as a series of acts or events, it will be appreciated that the present invention is not limited by the illustrated ordering of such acts or events. For example, some acts may occur in different orders and/or concurrently with other acts or events apart from those illustrated and/or described herein, in accordance with the invention. In addition, not all illustrated steps may be required to implement a methodology in accordance with the present invention. Furthermore, the methods according to the present invention may be implemented in association with the fabrication of ICs and composite transistors illustrated and described herein, as well as in association with other transistors and structures not illustrated, including but not limited to NMOS and/or PMOS composite transistors.

The method 100 begins at 102, wherein transistor fabrication is initiated, and transistor well formation and isolation processing is performed at 104. Act 104 thus defines NMOS and PMOS regions, wherein NMOS regions comprise a P-well in which n-type source/drain regions will later be formed, and PMOS regions comprise an N-well in which p-type source/drain regions will later be formed, respectively. In addition, isolation regions may comprise shallow trench isolation (STI) or field oxide regions (FOX) that serve to define various active areas and electrically isolate various active areas laterally from one another.

The method 100 continues at 106, wherein a gate oxide layer is formed in active areas defined by the various formed isolation regions. In one example, the gate oxide comprises a thin, thermally grown silicon dioxide layer, however, other type gate dielectrics (such as high-k dielectrics) may be formed and are contemplated by the present invention. A conductive gate layer is then deposited over the gate oxide at 108 and patterned to form a conductive gate electrode. For example, a polysilicon layer may be deposited via chemical vapor deposition (CVD) and patterned via etching to form gate electrodes in both NMOS and PMOS regions, respectively.

An offset spacer is then formed on lateral edges of the conductive gate electrodes at 110. For example, a thin offset layer (e.g., an oxide or nitride layer) is formed generally conformally over the patterned gate and then etched using a generally anisotropic dry etch to remove offset layer material on top of the gate and in the source/drain regions, leaving a thin offset spacer material on lateral edges of the gate. The offset spacer, as will be further appreciated below, is employed in this example to space away the strain inducing material slightly away from the channel region under the gate, for example, a distance of about 5 nm to about 20 nm. A recess is then formed in the moat area extending between the gate structure and the isolation regions at 112. The moat area refers to the active region of the silicon body where extension regions and subsequently source/drain regions may be formed. The recess is formed using, for example, a dry etching process such as the chemistry employed to etch STI trenches in the semiconductor body when forming isolation regions. The recesses, in one example extend into the semiconductor body to a depth of about 10–90 nm, and more preferably about 30–70 nm. In the present example, the gate structure is not masked during the recess formation; therefore if the gate electrode is composed of polysilicon, the recess formation process will also result in a recess formed in a top portion of the gate electrode material.

The extension region recess is formed at 112 using an isotropic etch. The isotropic etch causes a removal of silicon in the silicon body in all directions at approximately the same rate. Therefore the recess formed at 112 extends laterally under the offset spacers toward the channel region underlying the gate. For example, for an extension region recess depth of about 30–40 nm, a lateral extent to which the recess extends under the offset spacer may be about 15–20 nm. As will be further appreciated below, when the recess is subsequently filled with a stress inducing material, the material is physically closer to the channel than would otherwise be without an anisotropic recess etch. Consequently, the stress is more efficiently transferred to the channel.

In one aspect of the invention, the isotropic etch is performed with a wet etch that is highly selective with respect to oxide and nitride. For example, the wet etchant may comprise a strong base. For example, tetramethylammonium hydroxide $(CH_3)_4NOH$ (TMAH), choline, ethylenediamine, hydrazine or other quarternary ammonium hydroxide may be employed, as well as other suitable wet etchants. In such cases, selectivities of about 100:1 or more may be provided, wherein the silicon is etched without such etch impacting the offset spacers and the isolation (STI or FOX). In an embodiment of the present invention, prior to the recess formation, a short oxide strip (approximately 10 angstrom) with diluted HF (<1%) is performed in order to remove native oxide that may potentially block the etch of the semiconductor body. Although a wet etch is preferred, any isotropic dry etch having a substantially high selectivity to oxide or nitride may be employed and is contemplated as falling within the scope of the present invention. At the recess etch, a concentrated choline (greater than 5%) may be used to obtain a smooth recess surface. The bath temperature can range from about 20 C to about 100 C.

The method 100 then continues at 114, wherein a stress inducing material is formed in the recesses. The stress inducing material content is a function of whether a compressive or tensile strain is desired in the channel. For NMOS devices, a tensile strain in the channel will improve electron mobility, while for PMOS devices, a compressive strain in the channel will improve hole mobility. Therefore in accordance with one aspect of the present invention, a carbon-doped silicon material is formed in the extension region recesses via a selective epitaxial deposition process, such as an LPCVD (low pressure chemical vapor deposition) process using silane or disilane, methylsilane and HCl as the source gases. HCl is used for the selective deposition. By using methylsilane as an additional source gas, the silicon material formed in the recesses is incorporated with carbon in-situ. While not intending to be limited to any one theory, it is believed that the carbon-doped silicon within the recesses form an alloy that has a lattice with the same structure as the silicon body lattice, however, the carbon doped silicon alloy has a smaller spacing. Consequently, it is believed that the carbon-doped silicon within the recesses will tend to contract, thereby creating a tensile stress within the channel of the semiconductor body underneath the channel. In one example, the carbon-doped silicon material may be deposited while concurrently be doped in-situ with an n-type dopant such as arsenic or phosphorous. In that manner the n-type extension regions are formed concurrently with the stress inducing material in the extension region recesses.

According to another aspect of the present invention, for the formation of a PMOS device, silicon germanium is formed in the extension region recesses via a selective epitaxial deposition process such as an LPCVD (low pressure chemical vapor deposition) process using dichlorosilane and germane as the source gases. Preferably, the SiGe is doped in-situ during the selective epi deposition process by incorporating a p-type dopant reactant in the CVD process. For example, diborane or other type reactant may be employed, wherein a boron doped SiGe material is formed in the recesses (or other p-type dopant in the SiGe, as may be appreciated). The in-situ boron doping of the SiGe is preferred because it is believed that the in-situ doped boron is activated to a higher degree than when implanted into the SiGe, and therefore advantageously provides a lower extension region resistance.

While not intending to be limited to any one theory, it is believed that the silicon germanium within the recesses form an alloy that has a lattice with the same structure as the silicon body lattice, however, the silicon germanium has a larger spacing. Consequently, it is believed that the silicon germanium within the recesses will tend to expand, thereby creating a compressive stress within the channel of the semiconductor body underneath the channel.

If the stress inducing material are not doped n-type or p-type, respectively, during selective epi deposition processes, an extension region implant is then performed at 116, wherein dopants are introduced into the stress inducing materials within the recesses via implantation. For example, lightly doped, medium doped or heavily doped extension region implants are performed in the NMOS and PMOS regions separately using appropriate masking, as may be appreciated. A thermal process such as a rapid thermal anneal is then employed to activate the extension region dopants, which causes the extension regions to diffuse laterally slightly underneath the offset spacer toward the channels.

Still referring to FIG. 1, source/drain sidewall spacers are then formed on the gate structures at 118. The sidewall spacers comprise an insulating material such as an oxide, a nitride or a combination of such layers. The spacers are formed by depositing a layer of such spacer material(s) over the device in a generally conformal manner, followed by an anisotropic etch thereof, thereby removing such spacer material from the top of the gate structure and from the moat or active area and leaving a region on the lateral edges of the gate structure, overlying the offset spacers. The sidewall spacers are substantially thicker than the offset spacers, thereby resulting in the subsequently formed source/drain regions to be offset from lateral edges of the gate structure at least about 60 nm. The source/drain regions are then formed by implantation at 120, wherein a source/drain dopant is introduced into the exposed areas (top of gate electrode and active areas not covered by sidewall spacers). The source/drain regions are then completed with a thermal process to activate the dopant.

The method 100 then concludes with silicide processing at 122, wherein a metal layer is formed over the device, followed by a thermal process, wherein the metal and silicon interfaces react to form a silicide (on top of the gate and in the source/drain regions). Unreacted metal is then stripped away, and back end processing such as interlayer dielectric and metallization layers are formed at 124 to conclude the device formation at 126.

The method 100 of the present invention advantageously forms the extension region recesses using an isotropic etch. The isotropic etch advantageously removes silicon in the semiconductor body extending toward the channel. Consequently, the subsequent deposition of stress inducing material within the isotropically formed recesses resides closer to the channel. Therefore the impartation of stress to the center of the channel is substantially more efficient, thereby permitting either greater channel stress or lesser amounts of stress inducing species to be incorporated in the silicon for a given amount of stress. The reduction of the stress inducing species in some cases may result in a reduction of defects in the material, such as threading dislocation type defects.

Figure 2A:
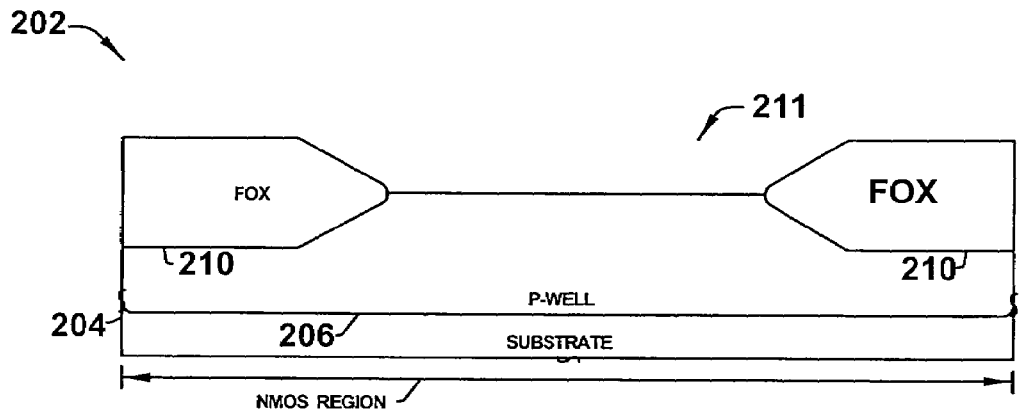
FIGS. 2A–2G are fragmentary cross section diagrams illustrating various steps of forming a transistor in accordance with the invention of FIG. 1.
Figure 2B:
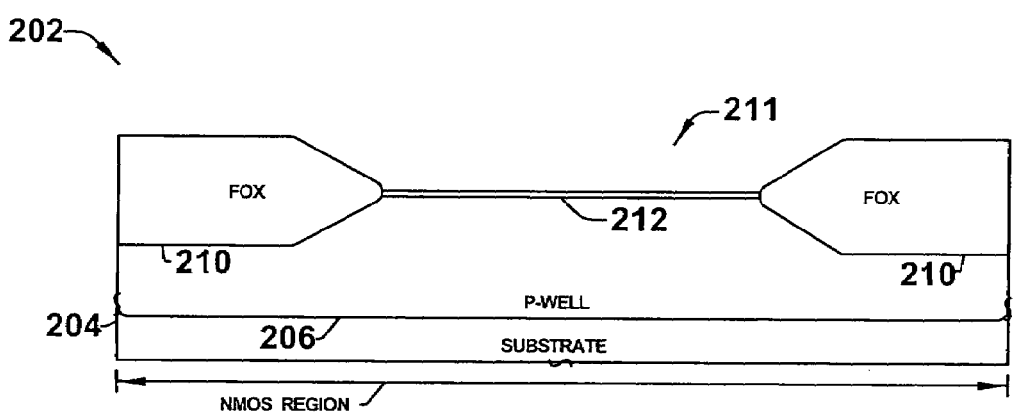

Turning now to FIGS. 2A–2G, a plurality of fragmentary cross section diagrams illustrating an NMOS transistor device being formed in accordance with the present invention of FIG. 1 is provided. Although the figures illustrate formation of an NMOS device, it should be understood that the various features of the present invention may also apply to a PMOS device, and such alternatives are contemplated by the present invention. In FIG. 2A, a transistor device 202 is provided, wherein a semiconductor body 204, such as a substrate, has a number of wells formed therein, such as a P-well 206 to define an NMOS transistor device region. Further, isolation regions 210 such as field oxide (FOX) or STI regions are formed in the semiconductor body to define active area regions 211, as may be appreciated. In FIG. 2B, the transistor device 202 is illustrated, wherein a gate dielectric 212 has been formed, for example, thermally grown $SiO_2$, over the active areas 211.

Figure 2C:
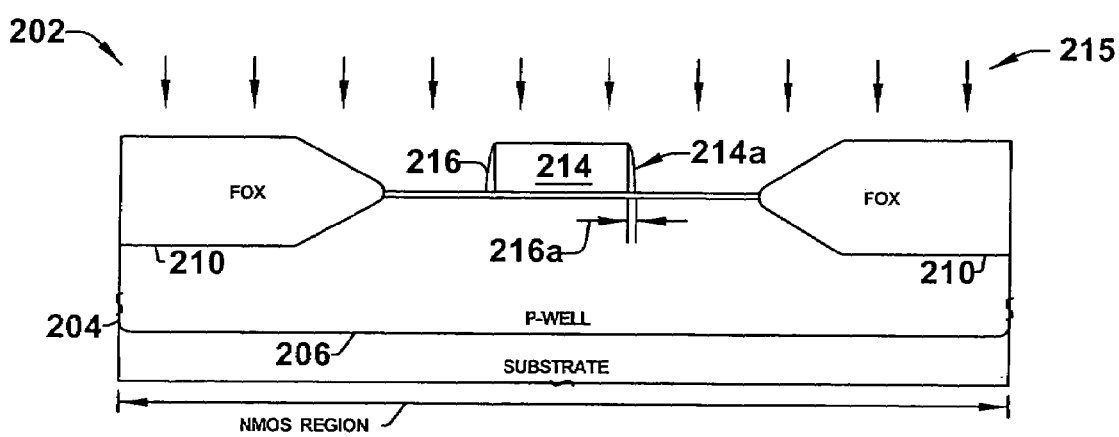
Figure 2D:
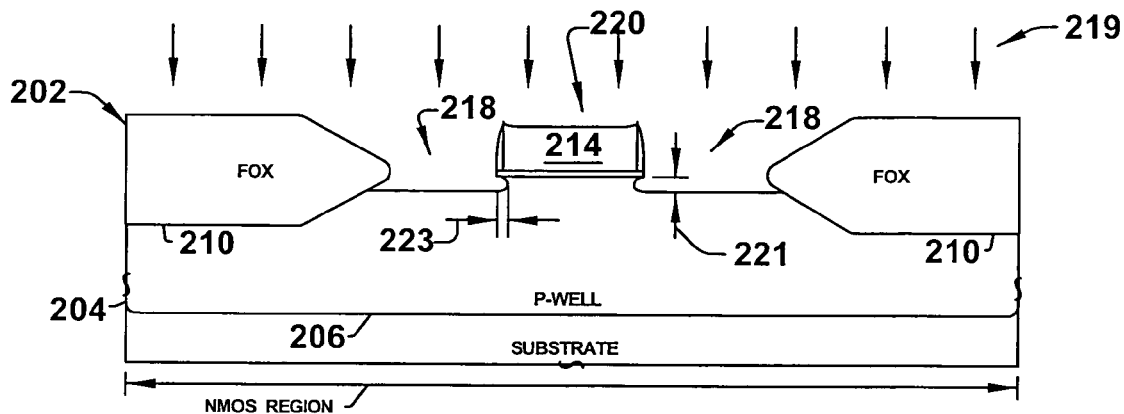

Referring to FIG. 2C, a conductive gate electrode material (e.g., polysilicon) has been deposited and patterned via an etching process 215 to form a gate electrode 214 overlying the gate oxide 212. An offset spacer 216 is then formed on the lateral edges 214a of the gate electrode, wherein the offset spacers have a width 216a of about 5–20 nm. Recesses 218 are then formed in the active areas using an isotropic etch process 219, wherein the gate electrode 214 and isolations areas 210 serve as a mask. In the case where the gate electrode comprises polysilicon, the etch process 219 will also create a recess 220 in a top portion of the gate structures, as illustrated in FIG. 2D. The recesses 218 are formed into the semiconductor body to a depth 221 of about 10–90 nm, and more preferably about 30–70 nm, and even more preferably 30–40 nm, for example. Although the example illustrated herein has the recesses 218 formed after an offset spacer 216, such recesses may be formed prior to such a spacer, wherein in such instance the recesses 218 are aligned to the lateral edges 214*a* of the gate structures. In such instances, care should be taken to prevent a shorting of the gate to the subsequently formed epi by providing some type of isolation therebetween.

In addition, because the extension region etch process 219 is isotropic, the recess extends laterally under the offset spacer 216 toward the channel a distance 223. For example, for a recess depth of about 30–40 nm, the lateral distance 223 may be about 15–20 nm. Consequently, stress inducing material subsequently formed in the recesses 218 will advantageously reside closer to the channel than compared to conventional solutions.

Figure 2E:
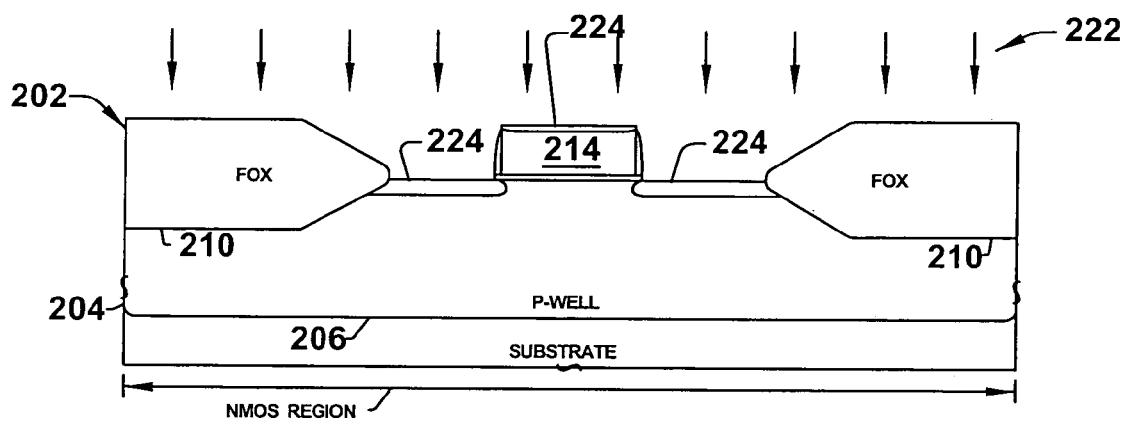

Turning now to FIG. 2E, a selective epitaxial deposition process 222 is provided, wherein a stress inducing material 224 is formed on top of the gate electrode 214 (in the recess 220) and also in the recesses 218. As highlighted above, the process 222 may comprise an epitaxial deposition process, wherein a carbon-doped silicon material 224 is formed in the extension region recesses 218 via a selective epitaxial deposition process 222, such as an LPCVD (low pressure chemical vapor deposition) process using silane/disilane, methylsilane and HCl as the source gases. By using methylsilane as an additional source gas, the silicon material formed in the recesses is incorporated with carbon in-situ. Such material may further be doped in-situ with an n-type dopant to form the n-type extension regions. Alternatively, if the device is a PMOS device, the stress inducing material is compressive, and the process 222 comprises a selective epi deposition process wherein a germanium containing source gas such as germane is added to the silane or dichlorosilane, such that a silicon germanium material is formed in the recesses. Further, in one example, the selective epi process further includes a diborane source gas to provide for the SiGe to be doped with boron in-situ. Alternatively, other p-type source gases may be employed, as may be appreciated.

Alternatively, the stress inducing material 224 may be formed in the recesses 218, 220, and then subsequently doped with n-type or p-type dopant to form the n-type or p-type extension regions, respectively, using appropriate masking techniques. A thermal process such as a rapid thermal anneal is then performed to activate the dopant, wherein a lateral diffusion of the extension regions under the offset spacer 216 is achieved.

Figure 2F:
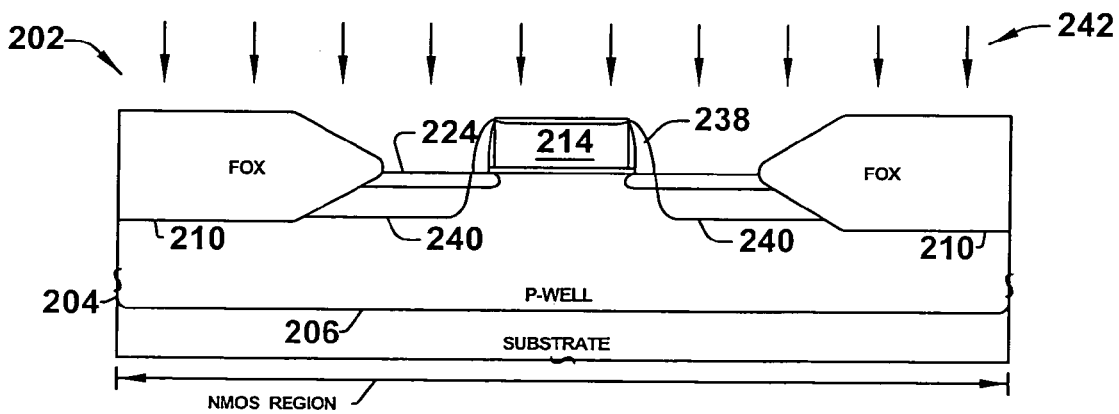

Source/drain sidewall spacers 238 are then formed over the offset spacers 216 on the lateral edges of the gate structures, as illustrated in FIG. 2F. An insulating sidewall material is deposited in a generally conformal manner over the device and subsequently subjected to an anisotropic etch to remove the insulating material on top of the gate and over the active areas, leaving sidewall spacers 238 overlying the offset spacers.

Source and drain regions 240 are then formed in the active areas using an implantation process 242, as illustrated in FIG. 2F. As discussed above in conjunction with the extension region implants, the source/drain implants 242 are performed with an NSD mask (not shown) and then a PSD mask (not shown) in order to implant the NMOS region and the PMOS region separately with n-type and p-type dopant, respectively. As can be seen in FIG. 2F, the source/drain regions 240 are self-aligned with respect to the sidewall spacers, and thus are laterally spaced from the extension regions 224 containing the stress inducing material.

Figure 2G:
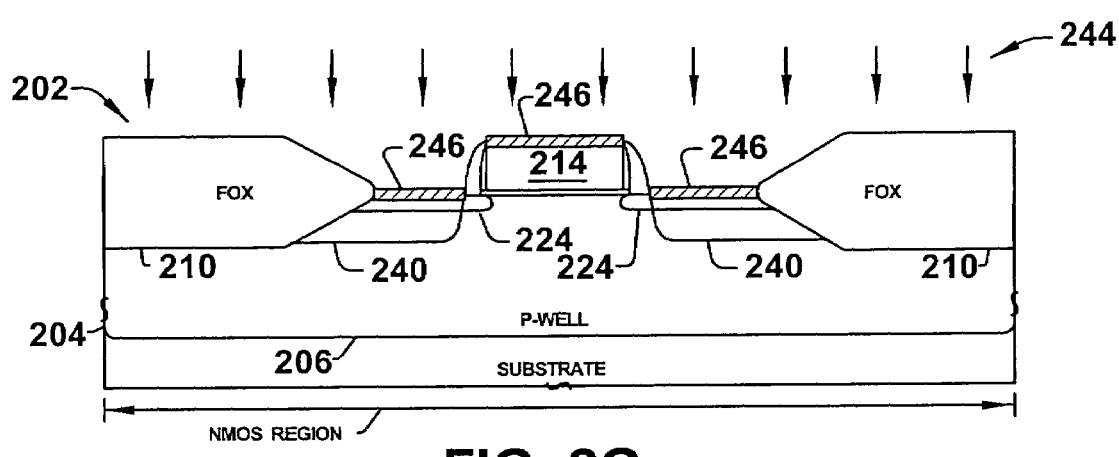

The method then concludes with silicidation, wherein a metal layer is deposited, for example, via sputtering, over the device, followed by a thermal process 244. During the thermal processing, those regions where the metal contacts silicon reacts to form a metal silicide, as illustrated in FIG. 2G. More particularly, the silicide 246 forms on the source/drain regions and on top of the gates as illustrated. Subsequently, back end processing including metallization may be performed to interconnect the various transistors, as may be desired.

Figure 3:
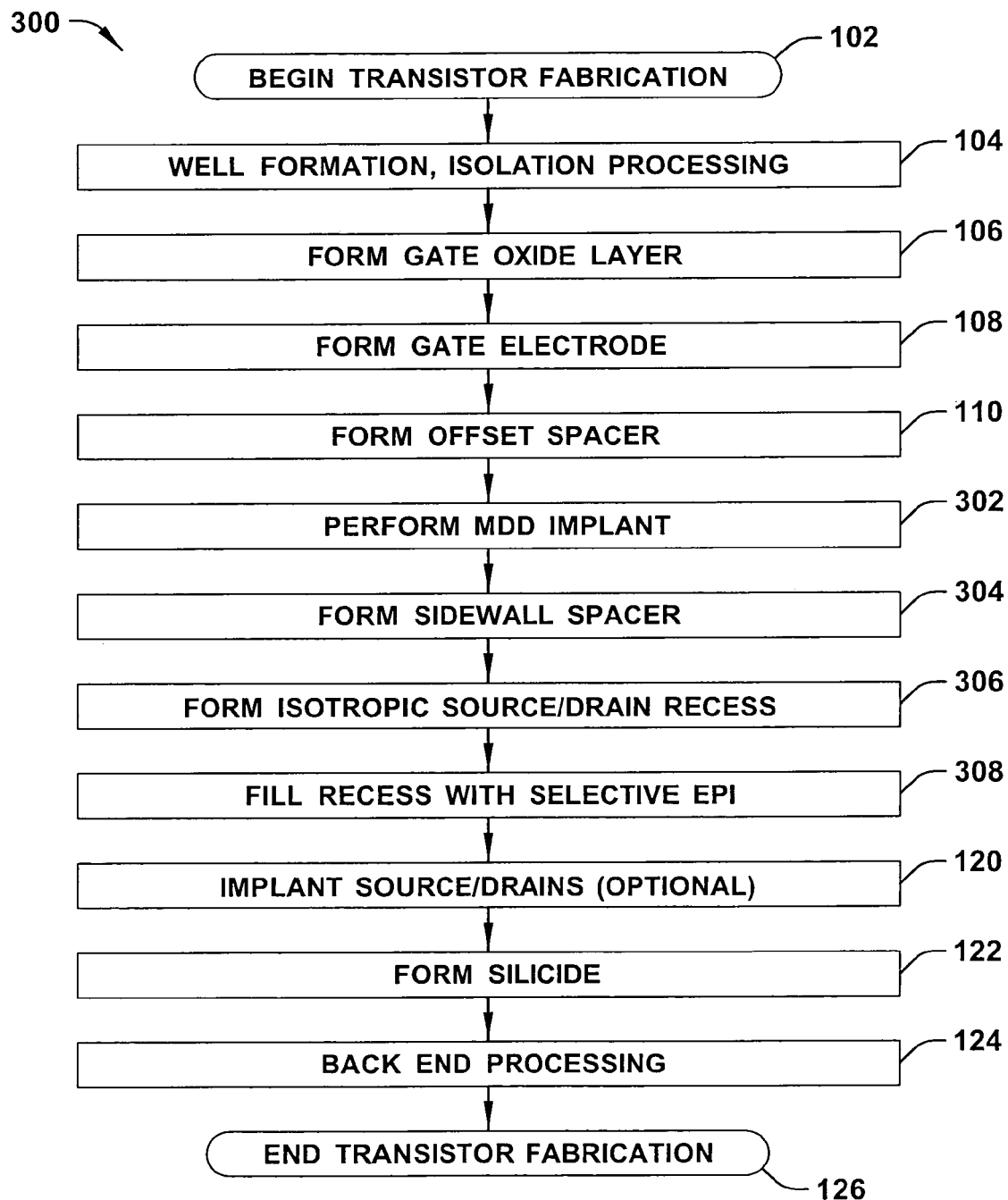
FIG. 3 is a flow chart diagram illustrating a method of forming a transistor having improved mobility according to another aspect of the present invention.

In accordance with another aspect of the invention, FIG. 3 is a flow chart directed to another method of forming a transistor device having improved mobility, wherein the isotropic etch is performed in the source/drain regions after the formation of the source/drain sidewall spacers. Therefore, the method 300 is similar in many respects to the method 100 of FIG. 1, and with regards to such aspects, those portions will not be repeated again. For example, acts 102–110 may proceed generally in the same manner as method 100. At 302, an extension region implant and anneal is performed after the offset spacer has been formed on lateral edges of the gate structure. Source/drain sidewall spacers are then formed overlying the offset spacers on the lateral edges of the gate at 304. Recesses are then formed in the exposed active area corresponding to the source/drain regions at 306, wherein the recesses are formed in the semiconductor body using an isotropic etch.

For example, as discussed above, such isotropic etch may be a wet or dry etch, however, the preferred etch is a wet etch (e.g., choline or TMAH, etc.) since the dielectric layer, such as silicon oxide and nitride used for sidewall spacer and STI fill, is much less impacted comparing to a dry etch process. The isotropic nature of the etch provides for the recess to extend under the source/drain sidewall spacer toward the channel. For example, the source/drain sidewall spacers may have a thickness of about 70 nm, and the recess may have a depth of about 60 nm. For a recess depth of about 60 nm, the recess extends under the sidewall spacer a distance of about 30 nm, for example. In the above manner, it can be seen that a location of stress inducing material subsequently formed in the recess will be closer to the channel that would otherwise be for an anisotropically formed recess. Consequently, the isotropically formed recess provides for a more efficient application of stress to the channel for improved carrier mobility. Returning to FIG. 3, the source/drain recesses are then filled with a selective epi deposition process with a stress inducing material at 308. As discussed supra, such stress inducing material may be for tensile stress (e.g., carbon-doped silicon) or for compressive stress (SiGe). Further, each deposition may further contain n-type dopant or p-type dopant to provide for doping of the source/drain regions in-situ. Alternatively, if the source/drain regions are not doped during the selective epi deposition process at 308, a source/drain implant may be performed after such deposition at 120. The method 300 may then follow with the formation of suicides at 122 and back end processing at 124, thereby concluding the method at 126.

Figure 4A:
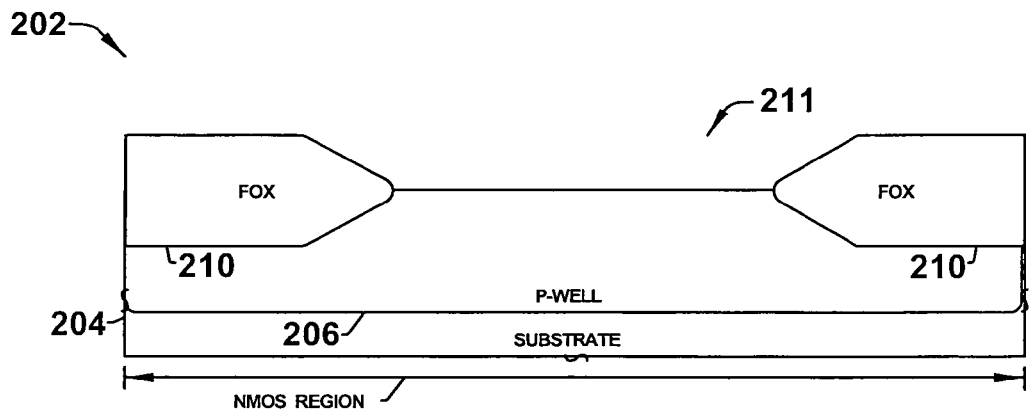
FIGS. 4A–4H are fragmentary cross section diagrams illustrating various steps of forming a transistor in accordance with the invention of FIG. 3.
Figure 4B:
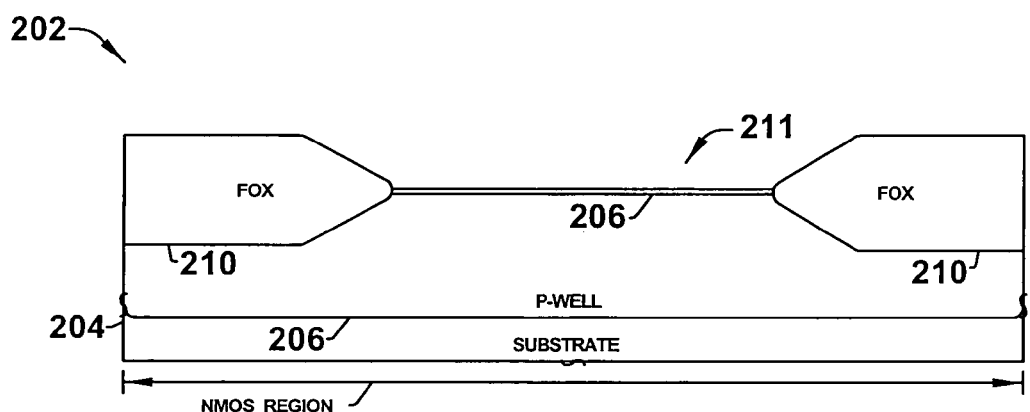
Figure 4C:
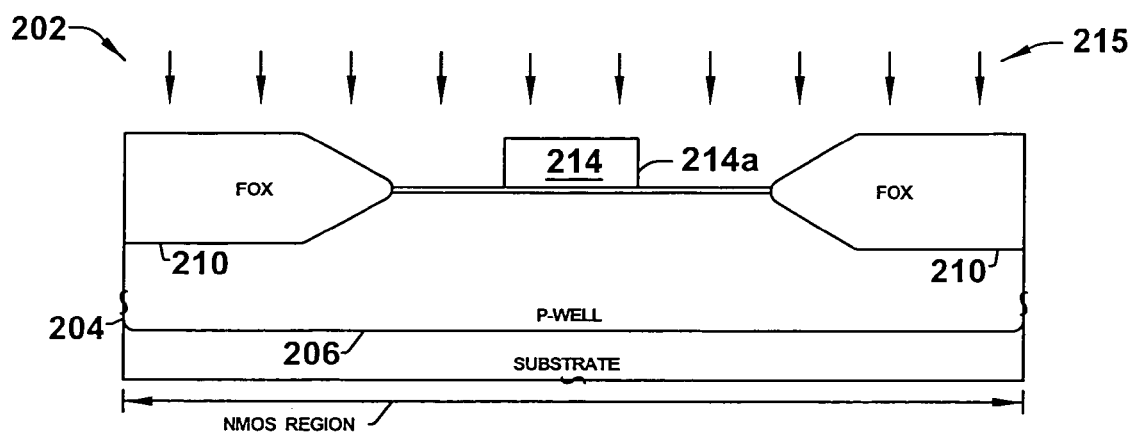
Figure 4D:
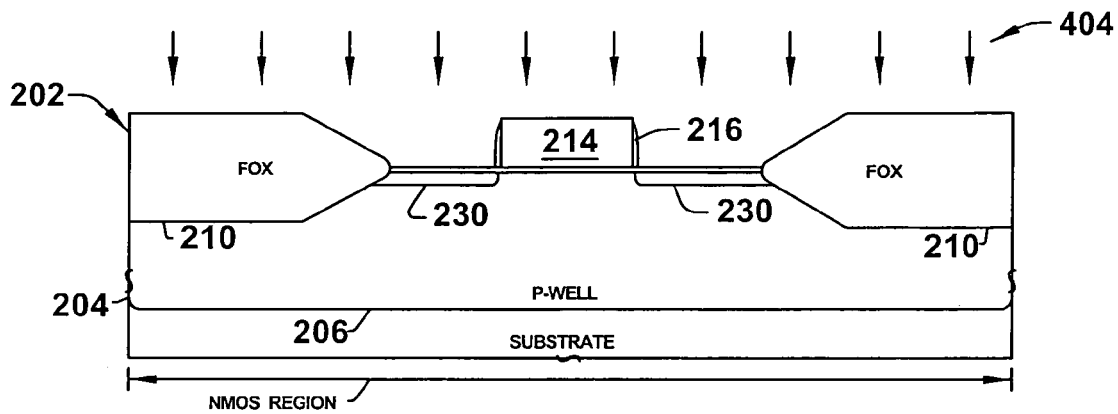

FIGS. 4A–4H illustrate the fabrication of the transistor devices in accordance with the method 300 of FIG. 3. As illustrated in FIG. 4A, a transistor device has an NMOS region with a P-well 206, however, the invention also applies to PMOS devices in N-wells. Isolation regions 210 also are provided to define active areas for fabrication of transistor devices. A gate oxide 212 overlies the active regions (FIG. 4B) and a patterned conductive gate electrode 214 is formed thereover (FIG. 4C). As illustrated in FIG. 4D, offset spacers 216 reside on lateral edges 214a of the gate 214 and an extension region implant process 404 (e.g., an n-type for an NMOS device) is provided to form extension regions 230. A subsequent thermal anneal (now shown) causes the extension regions 230 to diffuse laterally and extend slightly under the offset spacers 216.

Figure 4E:
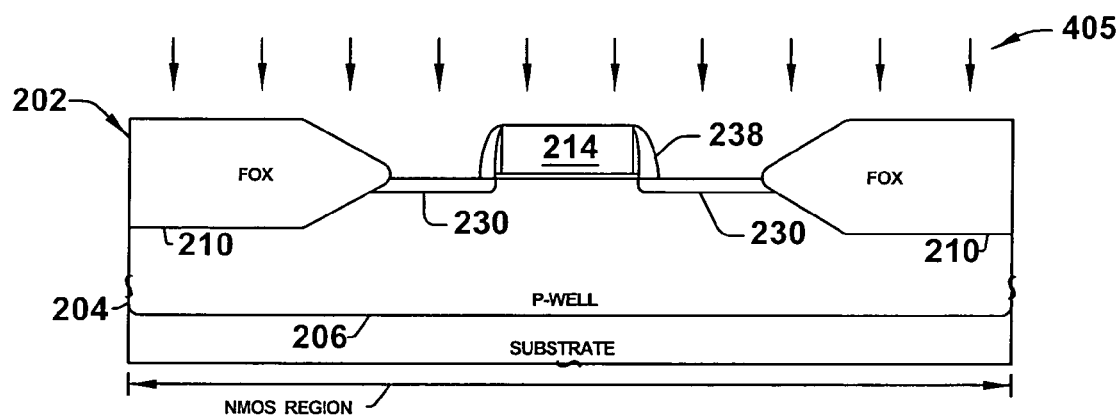
Figure 4F:
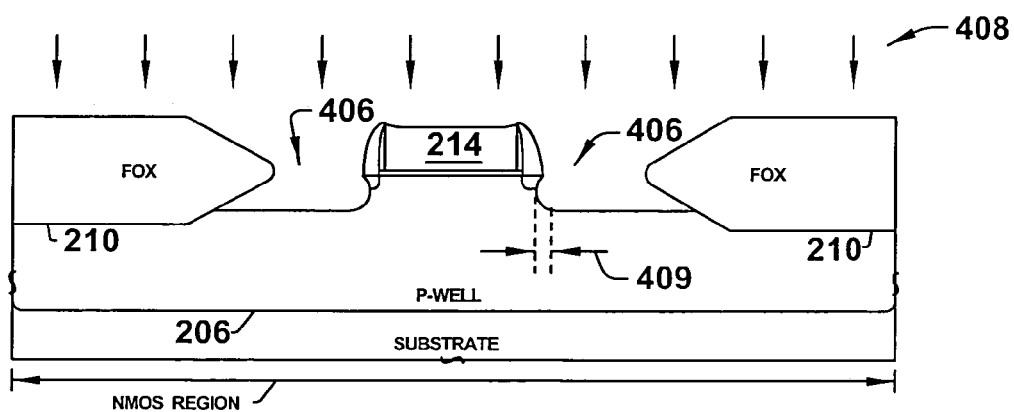

Sidewall spacers 238 are then formed by depositing an insulative material over the device and performing an anisotropic 405 etch to remove such material from a top of the gate 214 and away from the active region, as illustrated in FIG. 4E. Recesses 406 are then formed in the active areas (and on top of the gate electrodes 214) after the source/drain sidewall spacers 238 are formed, wherein such recesses are formed via an isotropic etch process 408, as illustrated in FIG. 4F. As discussed supra, the isotropic etch 408 causes the recess 406 to extend a distance 409 under the sidewall spacer 238. Therefore a stress inducing material subsequently formed in the recess 406 will be closer to the channel than would otherwise exist with an anisotropic recess etch.

Figure 4G:
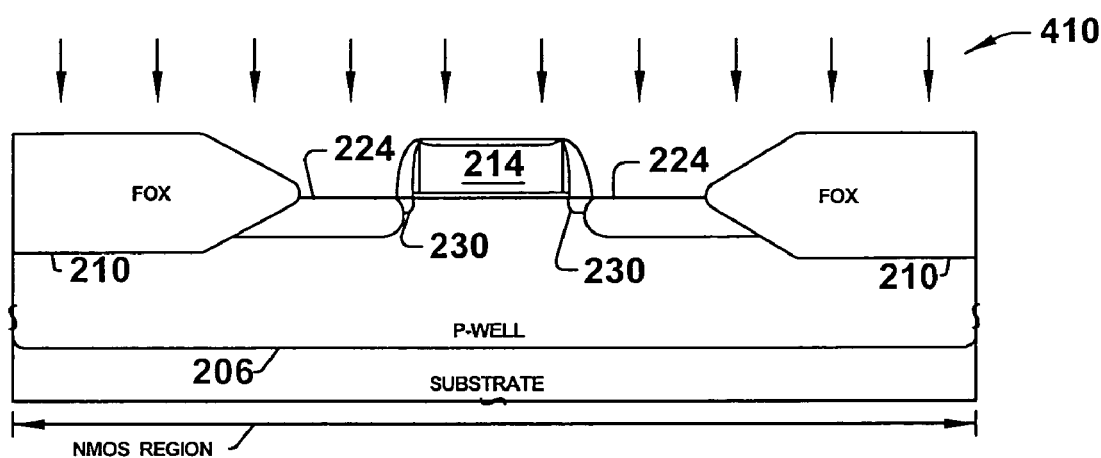

A stress inducing material 224 is then formed in the recesses 406 and on top of the gate electrode 214 as illustrated in FIG. 4G, via a selective epitaxial deposition process 410. As discussed supra, the stress inducing material may differ based on whether a tensile strain or compressive stain is desired. Since the example in FIG. 4G is an NMOS device a carbon-doped silicon material is formed therein in order to impart a tensile strain to the channel. In addition, an n-type dopant may be added in the selective epi deposition process in order to dope the source/drain regions in-situ. Alternatively, the selective epi deposition may be followed by a source drain implant.

Figure 4H:
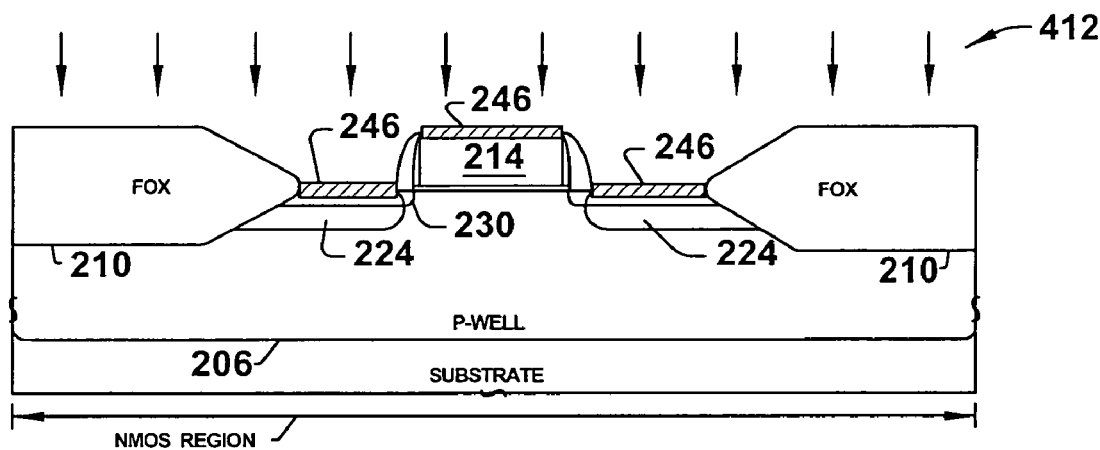

The device fabrication then concludes with the formation of silicide regions 246 via a silicidation process 412 followed by an back end processing, as illustrated in FIG. 4H.

While the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:

1. A method of forming a transistor, comprising:
   forming a gate structure over a semiconductor body;
   forming recesses using an isotropic etch using the gate structure as an etch mask, wherein the isotropic etch forms a recess in a top portion of the semiconductor body that extends laterally in the semiconductor body toward a channel portion of the semiconductor body underlying the gate structure;
   epitaxially growing silicon comprising stress inducing species in the recesses; and
   implanting source and drain regions into and through the silicon in the recesses of the semiconductor body on opposing sides of the gate structure, wherein a depth of the source and drain regions is deeper than the recesses.

2. The method of claim 1, further comprising forming offset spacers on lateral sidewalls of the gate structure, and wherein forming the recesses comprises performing the isotropic etch after forming the offset spacers, wherein the recess resides in an extension region of the semiconductor body, and extends laterally toward the channel.

3. The method of claim 2, wherein a width of the offset spacer is about 5 nm or more and about 20 nm or less, and wherein a depth of the recess is about 30 nm or more and about 40 nm or less, and wherein an extent to which the recess laterally extends below the offset spacer toward the channel is about 15 nm or more and about 20 nm or less.

4. The method of claim 1, further comprising:
   forming offset spacers on lateral sidewalls of the gate structure;
   forming extension regions in the semiconductor body aligned to the offset spacers; and
   forming sidewall spacers over the offset spacers, wherein forming the recesses comprises performing the isotropic etch after forming the sidewall spacers, wherein the recess resides in a source/drain region of the semiconductor body, and extends laterally toward the channel.

5. The method of claim 4, wherein a width of the offset spacer is about 70 nm, and wherein a depth of the recess is about 60 nm, and wherein an extent to which the recess laterally extends below the sidewall spacer toward the channel is about 30 nm.

6. The method of claim 1, wherein forming the recess using the isotropic etch comprises exposing the semiconductor device to a wet etchant that etches silicon and is highly selective with respect to insulative materials, thereby maintaining an integrity of any gate sidewall materials or any isolation regions.

7. The method of claim 1, wherein the wet etchant comprises a solvent comprising a strong base.

8. The method of claim 7, wherein the wet etchant comprises tetramethylammonium hydroxide, choline, ethylenediamine, hydrazine or other quartenary ammonium hydroxide.

9. A method of forming a transistor, comprising:
   forming a pate structure over a semiconductor body;
   forming recesses using an isotropic etch using the gate structure as an etch mask, wherein the isotropic etch forms a recess in the semiconductor body that extends laterally in the semiconductor body toward a channel portion of the semiconductor body underlying the gate structure;
   smoothing a surface of the recesses by exposing the semiconductor body to a concentrated choline bath having a choline concentration greater than about 5% with a bath temperature of about 20 C or more and about 100 C or less when forming the recesses;
   epitaxially growing silicon comprising stress inducing species in the recesses; and
   implanting source and drain regions into and through the silicon in the recesses of in the semiconductor body on opposing sides of the gate structure.

10. The method of claim 8, further comprising performing a wet clean prior to forming the recess, wherein the wet clean comprises exposing the semiconductor body to a diluted HF solution with an HF concentration of less than about 1%, thereby removing any native oxide that may exist on the semiconductor body prior to the formation of the recesses.

11. The method of claim 1, wherein the semiconductor body comprises an n-type material, and wherein forming the silicon containing the stress inducing species in the recess comprises performing a selective epitaxial deposition of silicon germanium in the presence of a p-type dopant containing source gas, wherein the p-type dopant dopes the epitaxially growing silicon germanium in-situ.

12. The method of claim 11, wherein the p-type dopant comprises boron, and wherein the boron doped silicon germanium resides in an extension region of the semiconductor body.

13. The method of claim 11, wherein the p-type dopant comprises boron, and wherein the boron doped silicon germanium resides in a source/drain region of the semiconductor body.

14. The method of claim 1, wherein the semiconductor body comprises a p-type material, and wherein forming the silicon containing the stress inducing species in the recess comprises performing a selective epitaxial deposition of silicon in the presence of a carbon containing source gas, wherein the carbon species incorporates with the silicon in-situ.

15. The method of claim 14, further comprising forming in the carbon-doped silicon material via selective epitaxial deposition in the presence of an n-type dopant source gas, wherein the carbon-doped silicon material is doped with an n-type dopant in-situ.

16. The method of claim 15, wherein the n-type dopant comprises one of arsenic or phosphorous, and wherein the n-type doped carbon-doped silicon resides in an extension region of the semiconductor body.

17. The method of claim 15, wherein the n-type dopant comprises one of arsenic or phosphorous, and wherein the n-type doped carbon-doped silicon resides in a source/drain region of the semiconductor body.

* * * * *